(12) United States Patent
Nakamura et al.

(10) Patent No.: US 9,920,428 B2
(45) Date of Patent: Mar. 20, 2018

(54) FILM DEPOSITION METHOD

(71) Applicants: Norikazu Nakamura, Kawasaki (JP);
Shoichi Miyahara, Kawasaki (JP);
Hiroshi Chiba, Kawasaki (JP)

(72) Inventors: Norikazu Nakamura, Kawasaki (JP);
Shoichi Miyahara, Kawasaki (JP);
Hiroshi Chiba, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 21 days.

(21) Appl. No.: 14/965,367

(22) Filed: Dec. 10, 2015

(65) Prior Publication Data

US 2016/0194757 A1    Jul. 7, 2016

Related U.S. Application Data

(62) Division of application No. 12/792,214, filed on Jun. 2, 2010, now Pat. No. 9,567,674.

(30) Foreign Application Priority Data

Jun. 10, 2009   (JP) .................................. 2009-139071
Oct. 28, 2009   (JP) .................................. 2009-247482

(51) Int. Cl.
    *C23C 14/00*      (2006.01)
    *C23C 14/32*      (2006.01)
        (Continued)

(52) U.S. Cl.
    CPC .......... *C23C 16/50* (2013.01); *C23C 14/0605* (2013.01); *C23C 14/325* (2013.01);
        (Continued)

(58) Field of Classification Search
    CPC .. C23C 14/0605; C23C 14/325; C23C 14/564
    See application file for complete search history.

(56) References Cited

U.S. PATENT DOCUMENTS 6,319,369 B1   11/2001   Flynn et al.
6,638,403 B1   10/2003   Inaba et al.
(Continued)

FOREIGN PATENT DOCUMENTS

JP   2002-008893 A   1/2002
JP   2002-025794 A   1/2002
(Continued)

OTHER PUBLICATIONS

Final Office Action dated Jan. 20, 2016, issued in U.S. Appl. No. 12/792,214 (18 pages).
(Continued)

*Primary Examiner* — Ibrahime A Abraham
(74) *Attorney, Agent, or Firm* — Westerman, Hattori, Daniels & Adrian, LLP

(57) ABSTRACT

A film deposition apparatus includes: a plasma generating section configured to generate plasma between a cathode target and an anode; a film deposition chamber in which a base material is placed; and a magnetic-field filter section configured to remove a particle from the plasma by a magnetic field and to transfer the plasma to the film deposition chamber. The magnetic-field filter section includes: a first housing area to which a first voltage is applied; and a second housing area, provided downstream of the first housing area in the moving direction of the plasma, to which a second voltage is applied.

7 Claims, 13 Drawing Sheets

(51) Int. Cl.
*C23C 16/50* (2006.01)
*C23C 14/06* (2006.01)
*C23C 14/56* (2006.01)
*H01J 37/32* (2006.01)
*H05H 1/50* (2006.01)

(52) U.S. Cl.
CPC ...... *C23C 14/564* (2013.01); *H01J 37/32055* (2013.01); *H01J 37/32357* (2013.01); *H05H 1/50* (2013.01)

(56) References Cited

U.S. PATENT DOCUMENTS

| | | |
|---|---|---|
| 6,875,326 B2 | 4/2005 | Inaba et al. |
| 2003/0094366 A1 | 5/2003 | Inaba et al. |
| 2007/0187229 A1 | 8/2007 | Aksenov et al. |
| 2010/0018859 A1 | 1/2010 | Shiina |
| 2011/0180403 A1 | 7/2011 | Shiina |

FOREIGN PATENT DOCUMENTS

| | | |
|---|---|---|
| JP | 2003-160858 A | 6/2003 |
| JP | 2005-158092 A | 6/2005 |
| JP | 2005-216575 A | 8/2005 |
| JP | 3860954 B2 | 12/2006 |
| JP | 2010-236032 A | 10/2010 |
| WO | 2008/038700 A1 | 4/2008 |

OTHER PUBLICATIONS

H. Takikawa et al., "DLC thin film preparation by cathodic arc deposition with a super droplet-free system", Surface and Coatings Technology, 2003, p. 368-73, vol. 163-164.

Chinese Office Action dated Feb. 23, 2012, issued in corresponding application 201010202850.1, with English Translation.

Non-Final Office Action dated May 18, 2016, issued in U.S. Appl. No. 12/792,214 (14 pages).

Notice of Allowance dated Oct. 5, 2016, issued in counterpart Application No. 12/792,214 (11 pages).

FILM DEPOSITION METHOD

CROSS-REFERENCE TO RELATED APPLICATIONS

This application is a divisional of U.S. application Ser. No. 12/792,214, filed on Jun. 2, 2010, which is based upon and claims the benefit of priority of the prior Japanese Patent Application No. 2009-139071, filed on Jun. 10, 2009 and Japanese Patent Application No. 2009-247482, filed on Oct. 28, 2009, the entire contents of which are incorporated herein by reference.

BACKGROUND

1. Field

Embodiment discussed herein relate to a film deposition apparatus and a film deposition method.

2. Description of Related Art

Magnetic recording apparatuses (hard disk drives) are used, for example, in information apparatuses such as computers, and hard disk video recorders.

A magnetic recording apparatus records data by magnetizing a magnetic disc rotating at high speed such as a recording layer of a disc-shaped magnetic recording medium with a recording element such as a writing head. The data recorded on the magnetic recording medium is read by a reproducing element such as a reading head, and is output after being converted into electric signals.

A protective film of a magnetic recording medium may be formed of, for example, silicon oxide ($SiO_2$), silicon nitride ($SiN_x$), or aluminum oxide ($Al_2O_3$). A carbon protective film mainly containing carbon may be formed by sputtering or chemical vapor deposition (CVD).

SUMMARY

According to one aspect of the embodiments, a film deposition apparatus is provided which includes: a plasma generating section configured to generate plasma between a target and an anode; a film deposition chamber in which a base material is placed; and a magnetic-field filter section configured to remove a particle from the plasma by a magnetic field and to transfer the plasma to the film deposition chamber, wherein the magnetic-field filter section includes: a first housing area to which a first voltage is applied; and a second housing area, provided downstream of the first housing area in the moving direction of the plasma, to which a second voltage is applied.

Additional advantages and novel features of the invention will be set forth in part in the description that follows, and in part will become more apparent to those skilled in the art upon examination of the following or upon learning by practice of the invention.

DESCRIPTION OF EMBODIMENTS

The thickness of a carbon protective film formed by CVD may be about 4 nm. A carbon protective film may be formed by a filtered cathodic arc (FCA) method using an arc as a plasma source.

Since the FCA method utilizes arc discharging in which a discharge ignition temperature is 10000° C. or more, carbon having a high heat resistance may be melted or sublimated easily. Film deposition may be performed using only carbon as the material.

Since a carbon protective film formed by the FCA method has a high proportion of an sp3 bonding component, the density and hardness thereof may be higher than those of a carbon protective film formed by CVD. A carbon protective film having a thickness of 2 nm formed by the FCA method may have a durability higher than or equal to that of a carbon protective film having a thickness of 4 nm formed by CVD. An apparatus that performs film deposition by the FCA method is referred to as an FCA film deposition apparatus.

Since plasma is generated by arc discharging in the FCA method, carbon particles may be produced during formation of a carbon protective film. Carbon particles may be microparticles having a diameter of, for example, about 0.01 to several hundred micrometers. If the particles adhere onto a surface of a magnetic recording medium during formation of a protective film, durabilities and corrosion resistances of the magnetic recording medium and a magnetic recording apparatus may be reduced.

Figure 1:
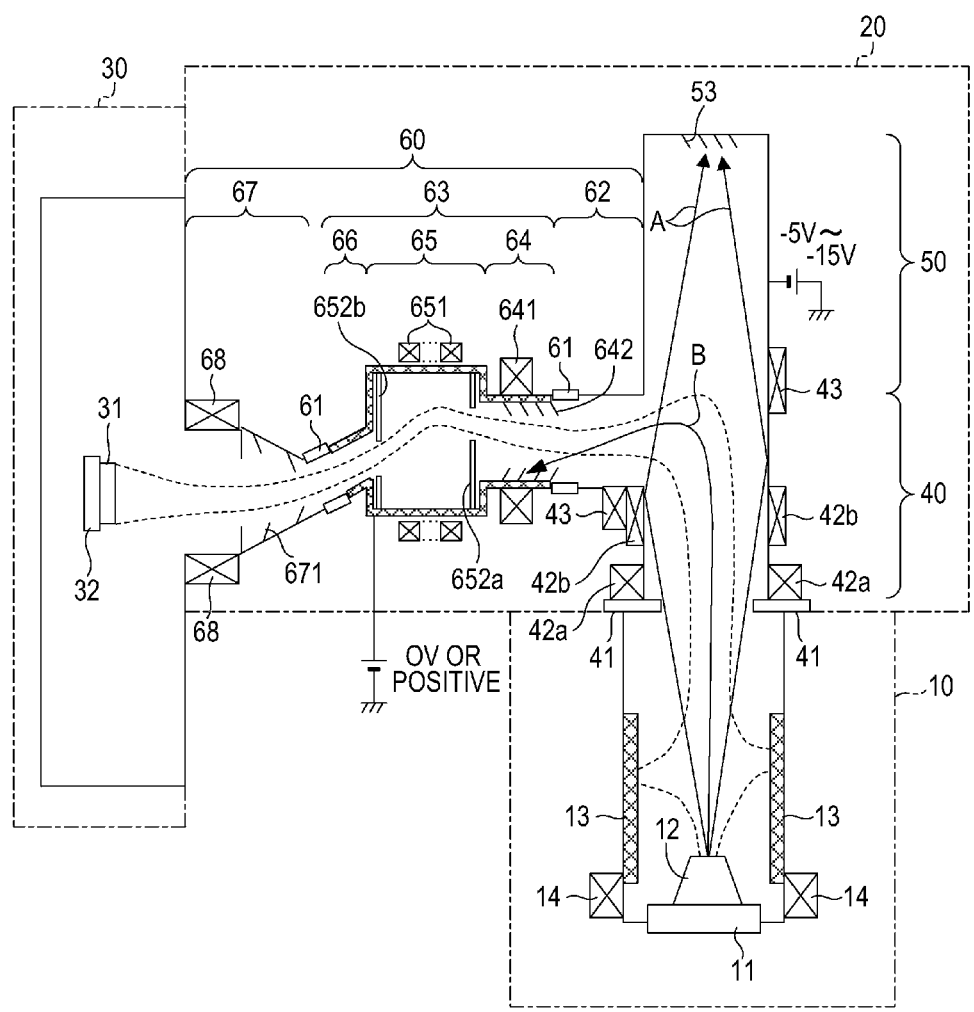
FIG. 1 illustrates an exemplary film deposition apparatus.

FIG. 1 illustrates an exemplary film deposition apparatus. The film deposition apparatus illustrated in FIG. 1 includes a plasma generating section 10, a magnetic-field filter section 20, and a film deposition chamber 30. Housings of the plasma generating section 10, the magnetic-field filter section 20, and the film deposition chamber 30 may be mainly formed of metal such as stainless steel. The magnetic-field filter section 20 may be divided into a plasma separation unit 40, a particle trap unit 50, and a plasma transfer unit 60.

The plasma generating section 10, the plasma separation unit 40, and the particle trap unit 50 may be cylindrical. The plasma generating section 10, the plasma separation unit 40, and the particle trap unit 50 are arranged in that order from the bottom and are coupled in line.

The plasma transfer unit 60 may be cylindrical. One end of the plasma transfer unit 60 is substantially perpendicularly coupled to the plasma separation unit 40, and the other end thereof is coupled to the film deposition chamber 30. The film deposition chamber 30 includes a stage 32 on which a substrate 31 to be subjected to film deposition, for example, a base material is placed.

An insulating plate 11 is provided at a lower end of the housing of the plasma generating section 10, and a target, for example, a cathode 12 is placed on the insulating plate 11. A cathode coil 14 is provided on the outer periphery of the lower end of the housing of the plasma generating section 10, and an anode 13 is provided on an inner surface of the housing. During film deposition, a certain voltage is applied from a power supply (not illustrated) to the cathode target 12 and the anode 13, so that arc discharging is caused there between and plasma is generated above the cathode target 12. Further, a certain current is supplied from the power supply to the cathode coil 14 so as to produce a magnetic field for stabilizing arc discharging.

Since a component of the target 12 is evaporated by arc discharging, ions of a film deposition material are supplied into the plasma. For this reason, the target 12 may include the film deposition material. For example, when a carbon protective film is formed on the substrate 31, graphite may be used as the target 12. The plasma generating section 10 includes a trigger electrode (not illustrated) for applying a voltage that triggers arc discharging. A reactive gas or an inert gas may be supplied into the plasma generating section 10 as necessary.

The diameter of the plasma separation unit 40 in the magnetic-field filter section 20 may be smaller than the diameter of the plasma generating section 10. An insulating ring 41 is provided at a boundary between the plasma generating section 10 and the plasma separation unit 40, and electrically separates the housing of the plasma generating section 10 and the housing of the plasma separation unit 40. For example, the insulating ring 41 includes fluorine resin having a high insulation performance.

Guide coils 42a and 42b are provided on the outer periphery of the housing of the plasma separation unit 40 so as to generate magnetic fields for moving the plasma generated in the plasma generating section 10 in a given direction while converging the plasma to the center of the housing. Near a coupling portion between the plasma separation unit 40 and the plasma transfer unit 60, an oblique-magnetic-field generating coil 43 is provided to generate a magnetic field for bending the moving direction of the plasma about 90°, for example, an "oblique magnetic field".

The particle trap unit 50 may be provided on the plasma separation unit 40. Electrically neutral particles or particles having a low electric charge for their mass generated in the plasma generating section 10 may come straight into the particle trap unit 50 without any influence of the magnetic field of the plasma separation unit 40. A plurality of fins 53 for trapping the particles are provided at an upper end of the particle trap unit 50, and are arranged obliquely with respect to an inner surface of the housing. The particles entering the particle trap unit 50 may dissipate kinetic energy by being reflected by the fins 53 a plurality of times, and may be finally trapped by the fins 53 or the wall surface of the housing.

The plasma separated from the particles in the plasma separation unit 40 enters the plasma transfer unit 60. The plasma transfer unit 60 may be divided into a plasma-separation-unit-side connecting portion 62, a particle trap portion 63, and a film-deposition-chamber-side connecting portion 67.

An insulating ring 61 is provided between the plasma-separation-unit-side connecting portion 62 and the particle trap portion 63, and an insulating ring 61 is also provided between the particle trap portion 63 and the film-deposition-chamber-side connecting portion 67. The insulating rings 61 may include a material having a high insulation performance, for example, fluorine resin. The particle trap portion 63 is electrically separated from the plasma-separation-unit-side connecting portion 62 and the film-deposition-chamber-side connecting portion 67 by the insulating rings 61. For example, a voltage lower by about 5 to 15 V than a ground voltage (0 V) may be applied to the plasma separation unit 40 and the plasma-separation-unit-side connecting portion 62, and a ground voltage or a positive voltage may be applied to the particle trap portion 63.

The particle trap portion 63 is divided into an entrance portion 64 close to the plasma separation unit 40, an exit portion 66 close to the film deposition chamber 30, and an intermediate portion 65 provided therebetween. On the outer periphery of the entrance portion 64, a guide coil 641 is provided to generate a magnetic field for converging and moving the plasma toward the film deposition chamber 30. On an inner side of the entrance portion 64, a plurality of fins 642 for trapping particles entering the entrance portion 64 are arranged obliquely with respect to an inner surface of the housing.

The diameter of the intermediate portion 65 may be larger than the diameters of the entrance portion 64 and the exit portion 66. On sides of the intermediate portion 65, each of which is close to the entrance portion 64 or the exit portion 66, deposition preventing plates (apertures) 652a and 652b having apertures for limiting a passage of the plasma are provided respectively. The aperture of the deposition preventing plate 652a may be provided on a relatively upper side, and the aperture of the deposition preventing plate 652b may be provided on a relatively lower side. Guide coils 651 for generating magnetic fields for bending the moving direction of the plasma may be provided on the outer periphery of the intermediate portion 65.

To ensure a space for bending the moving direction of the plasma, the diameter of the intermediate portion 65 may be larger than the diameters of the entrance portion 64 and the exit portion 66. The particles entering the intermediate portion 65 may dissipate kinetic energy because of repetitive reflection in the intermediate portion 65, and may be adsorbed onto a wall surface of the intermediate portion 65.

The center axis of the entrance portion 64 substantially may coincide with the center axis of the intermediate portion 65. The exit portion 66 projects obliquely downward from the aperture of the deposition preventing plate 652b.

The film-deposition-chamber-side connecting portion 67 is formed in a manner such that the diameter thereof gradually increases from the particle trap portion 63 toward the film deposition chamber 30. A plurality of fins 671 are arranged in the film-deposition-chamber-side connecting portion 67. On the outer periphery of a boundary portion between the film-deposition-chamber-side connecting portion 67 and the film deposition chamber 30, a guide coil 68 is provided to converge and move the plasma toward the film deposition chamber 30.

The stage 32 on which the substrate 31 is to be placed is provided in the film deposition chamber 30. A surface of the substrate 31, for example, a film deposition surface faces the direction from which the plasma flows in. A mechanism for tilting the substrate 31 relative to the plasma inflow direction or a mechanism for turning the substrate 31 may be provided in the stage 32. For example, the film deposition chamber 30 is coupled to a vacuum device (not illustrated). The vacuum device maintains a given pressure in the internal space of the film deposition apparatus. The substrate 31 may include a substrate for a magnetic recording medium having a recording layer (magnetic layer) and a substrate for a magnetic head having a recording element and a reproduction element.

With film deposition, particles may adhere to the fins 53, 642, and 671 and the deposition preventing plates 652a and 652b. If the number of adhering particles increases, the particles may separate from the fins 53, 642, and 671 or the deposition preventing plates 652a and 652b and may move toward the film deposition chamber 30. Hence, the fins 53, 642, and 671 and the deposition preventing plates 652a and 652b may be easy to replace. The housing of the particle trap portion 63 may be replaceable.

When forming a carbon film on the substrate 31, graphite may be used as the cathode target 12. The vacuum device keeps the pressure in the film deposition apparatus at $10^{-5}$ to $10^{-3}$ Pa. For example, plasma may be generated on the conditions that the arc current is 70 A, the arc voltage is 25 V, and the cathode coil current is 10 A. The plasma includes ions of carbon that serves as the film deposition material.

The plasma generated by the plasma generating section 10 enters the plasma separation unit 40 of the magnetic-field filter section 20, and is moved close to the coupling portion to the plasma transfer unit 60 by magnetic fields generated by the guide coils 42a and 42b. The moving direction of the plasma is bent by an oblique magnetic field generated by the oblique-magnetic-field generating coil 43, and the plasma then enters the plasma transfer unit 60. Broken lines in FIG. 1 indicate a moving path of the plasma.

Most of the particles generated by arc discharging in the plasma generating section 10 may have no charge or may have an extremely low charge for the mass. Most of the particles generated by arc discharging may not be influenced by the magnetic fields generated by the guide coils 42a and 42b and the oblique-magnetic-field generating coil 43, and may enter the particle trap unit 50 directly or while being reflected by the inner surface of the housing of the plasma separation unit 40. In the particle trap unit 50, the particles are trapped by the fins 53 and so on. Arrows A in FIG. 1 indicate moving directions of the particles.

Most of the particles generated in the plasma generating section 10 enter the particle trap unit 50, and are trapped by the fins 53 and so on in the particle trap unit 50. Some of the particles that repeat reflection by the inner surface of the housing enter the plasma transfer unit 60. These particles may be trapped by the fins 642 and the deposition preventing plates 652a and 652b, and may not reach the film deposition chamber 30.

Positively charged fine particles, of the particles generated in the plasma generating section 10, are caused to bend their moving direction by the oblique magnetic field generated by the oblique-magnetic-field generating coil 43, and enter the plasma transfer unit 60 together with the plasma. Since a negative voltage, for example, a voltage within the range of −5 to −15 V is applied to the plasma separation unit 40 and the plasma-separation-unit-side connecting portion 62, the positively charged fine particles are separated from the plasma, for example, as illustrated by arrow B in FIG. 1. The separated particles move toward the wall surface of the housing, and are trapped by the wall surface of the particle trap portion 63, the fins 642, and the deposition preventing plate 652a.

The particles may be removed from the plasma passing through the plasma transfer unit 60. A path in the plasma transfer unit 60 through which the plasma moves may be nonlinear or may be curved complicatedly. For this reason, the movement of the particles having a large mass with respect to the gaseous film deposition component together with the plasma may be reduced, and the particles may be separated from the plasma.

The plasma passing through the particle trap portion 63 enters the film deposition chamber 30 via the film-deposition-chamber-side connecting portion 67, and carbon is deposited on the substrate 31 to form a carbon film. The fins 671 are also provided on the inner surface of the film-deposition-chamber-side connecting portion 67, and the particles passing through the particle trap portion 63 may be trapped by the fins 671.

A negative voltage is applied to the plasma-separation-unit-side connecting portion 62, and the particles included in the plasma are removed. Hence, a high-quality and high-density carbon film that includes reduced particles may be formed on the substrate 31.

To remove the particles from the plasma, a negative voltage may be applied to the entire magnetic-field filter section 20.

By applying a negative voltage to the plasma separation unit 40 and the plasma-separation-unit-side connecting portion 62, particles may be removed from the plasma that enters the plasma transfer unit 60. The voltage applied to the particle trap portion 63, which is provided downstream of the plasma-separation-unit-side connecting portion 62 in the plasma moving direction, may be set to be higher than or equal to the ground voltage. The number of particles included in the formed film may change substantially. Since the film deposition material included in the plasma is not trapped by the surface of the housing, the film deposition speed at which the carbon film is formed on the surface of the substrate 31 may increase.

When the voltage to be applied to the plasma separation unit 40 and the plasma-separation-unit-side connecting portion 62 is higher than −5 V, the particles may not be removed from the plasma. In contrast, when the voltage to be applied to the plasma separation unit 40 and the plasma-separation-unit-side connecting portion 62 is lower than −15 V, the film deposition material, for example, carbon ions included in the plasma may be trapped by the surface of the housing. This may reduce the film deposition speed. Thus, the voltage applied to the plasma separation unit 40 and the plasma-separation-unit-side connecting portion 62 may be within the range of −5 to −15 V.

Figure 2A:
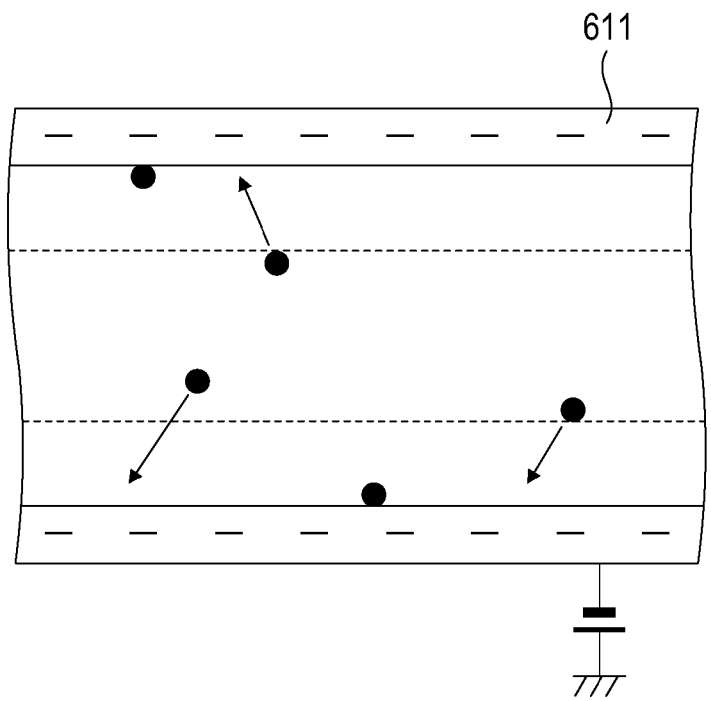
FIGS. 2A and 2B illustrate exemplary examples.
Figure 2B:
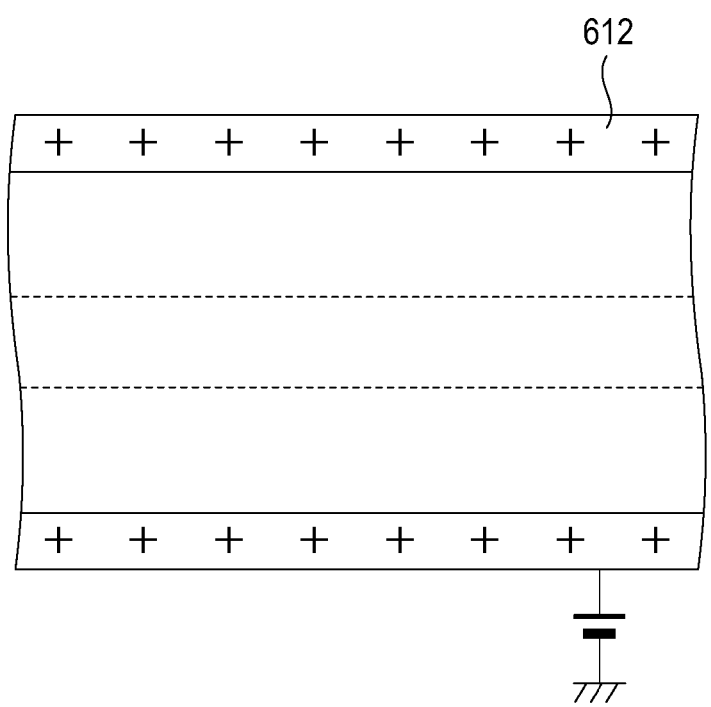

FIGS. 2A and 2B illustrate exemplary plasma. Plasma illustrated in FIG. 2A may be plasma that passes through a housing 611 to which a negative voltage is applied. Plasma illustrated in FIG. 2B may be plasma that passes through a housing 612 to which a positive voltage is applied. As illustrated in FIG. 2A, when plasma passes through the housing 611 to which a negative voltage is applied, positively charged particles included in the plasma are separated from the plasma, and are adsorbed onto the housing surface. When the plasma passes through the housing 611 to which the negative voltage is applied, the width of the plasma is increased by the charges on the housing surface, as illustrated by broken lines in FIG. 2A, and a part of the film deposition material included in the plasma may also be trapped onto the housing surface.

When the plasma passes through the housing 612 to which the positive voltage is applied, the width of the plasma is decreased by the charges on the housing surface, as illustrated by broken lines in FIG. 2B. For this reason, the film deposition material included in the plasma may not be trapped onto the housing surface.

A carbon film may be formed on a sample under the conditions that the voltage to be applied to the plasma separation unit 40 and the plasma-separation-unit-side connecting portion 62 is −15 V, and the voltage to be applied to the particle trap portion 63 is −15 V, −8.8 V, 0 V (ground voltage), +8.8 V, or +15 V. During film deposition, the arc current and the arc voltage may be set at 70 A and 25 V, respectively.

Figure 3:
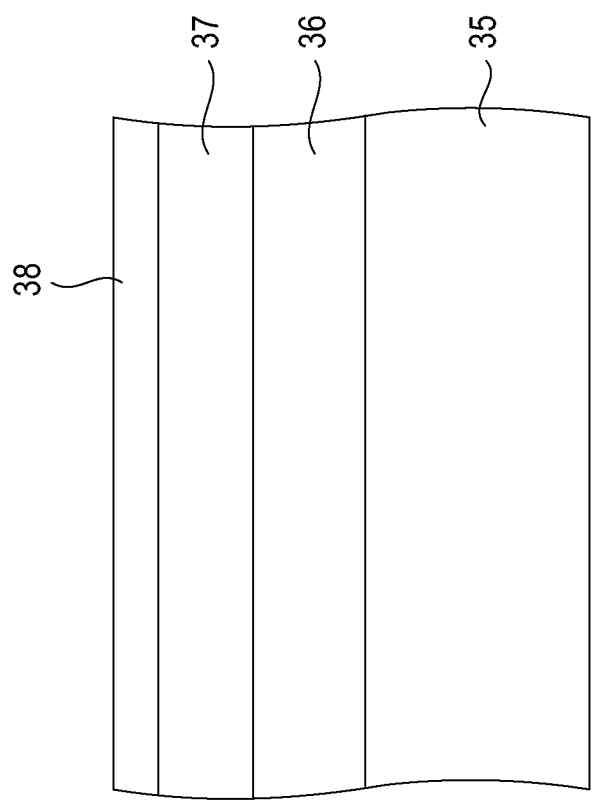
FIG. 3 illustrates an exemplary sample.

FIG. 3 illustrates an exemplary sample. The sample includes a glass substrate 35 for a magnetic recording medium having a diameter of 2.5 inches (about 64 mm). Referring to FIG. 3, an underlying film 36 including a magnetic material, and a recording layer, for example, a Co alloy layer 37 are formed on the substrate 35, and a carbon film 38 having a thickness of, for example, 3 nm is formed thereon by the film deposition apparatus. The cathode target 12 may contain graphite.

Figure 4:
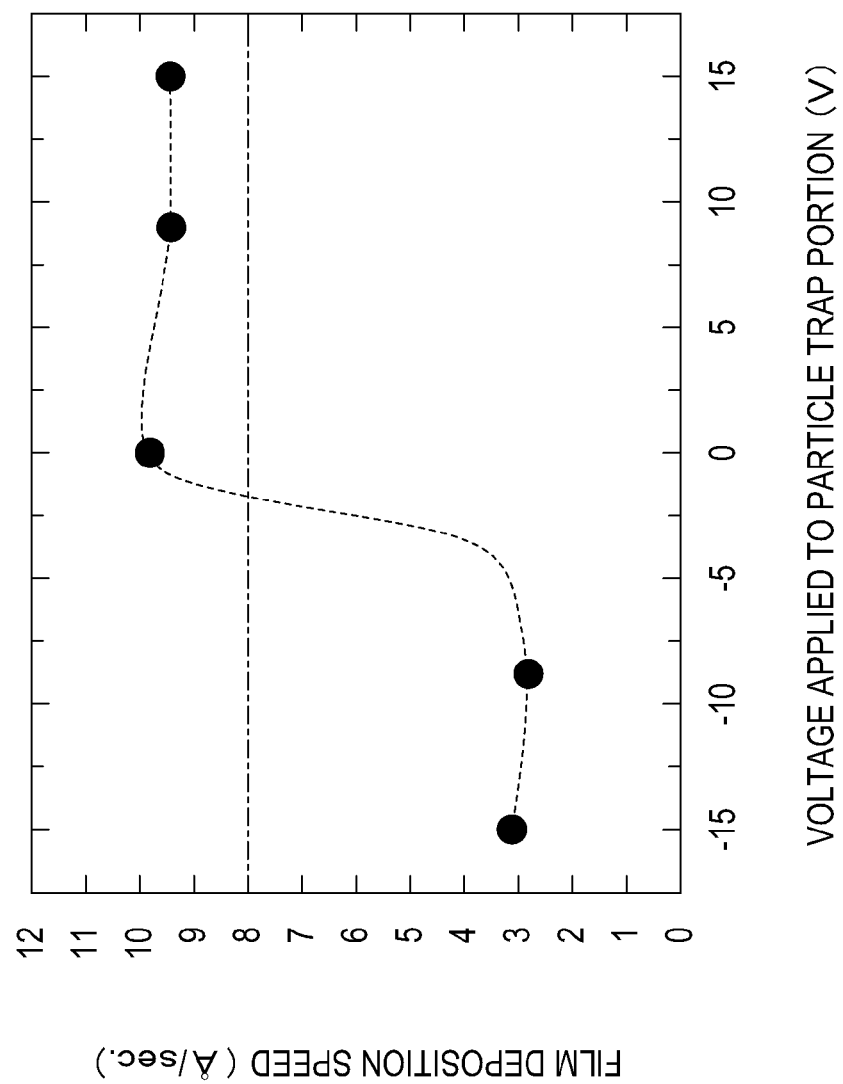
FIG. 4 illustrates an exemplary relationship between an applied voltage and a film deposition speed.

FIG. 4 illustrates an exemplary relationship between an applied voltage and a film deposition speed. The horizontal axis indicates the voltage applied to the particle trap portion 63, and the vertical axis indicates the film deposition speed. In FIG. 4, a one-dot chain line indicates a film deposition speed (about 8 Å/sec) of a carbon film using CVD. By setting the voltage applied to the particle trap portion 63 to be higher than or equal to the ground voltage (0 V), the film deposition speed may become higher than that of CVD.

Figure 5:
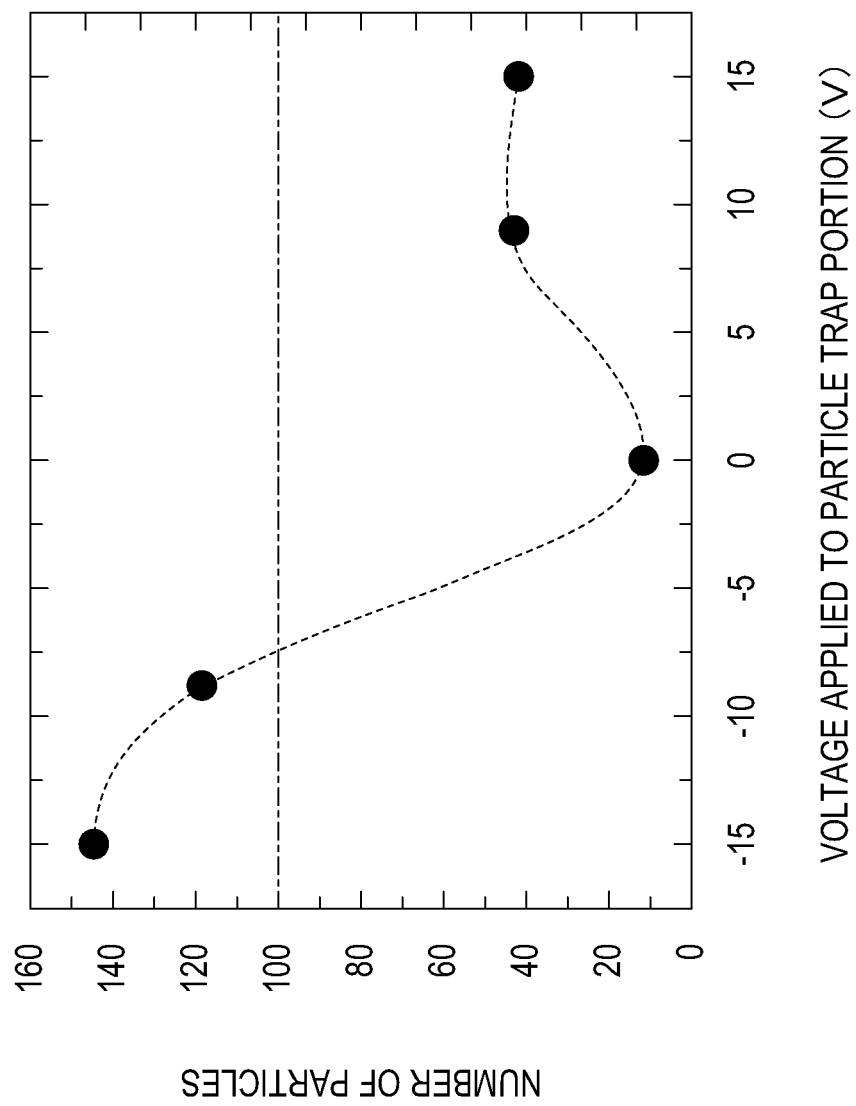
FIG. 5 illustrates an exemplary relationship between an applied voltage and a number of particles.

FIG. 5 illustrates an exemplary relationship between an applied voltage and a number of particles. The horizontal axis indicates the voltage applied to the particle trap portion 63, and the vertical axis indicates the number of particles in one substrate, for example, having a diameter of 2.5 inches. In FIG. 5, a one-dot chain line indicates the number of particles included in a carbon film formed by CVD, for example, about 100 particles. The number of particles may be counted by a particle counter such as OSA-5100 from Candela Instruments.

When the voltage applied to the particle trap portion 63 is substantially equal to the ground voltage (0 V), the number of particles in one substrate may be small. The number of particles in one substrate may be about ten. When a positive or negative voltage is applied to the particle trap portion 63, the number of particles may increase. When the voltage applied to the particle trap portion 63 is positive, the number of particles in one substrate may be 50 or less, which may be half or less the number of particles in a substrate formed by CVD.

The above-described film deposition apparatus may form a high-quality carbon film that includes a reduced number of particles.

The voltage applied to the plasma-separation-unit-side connecting portion 62 may be a direct-current voltage, or an alternating-current voltage or a pulse voltage biased to the negative side. The voltage applied to the particle trap portion 63 may be an alternating-current voltage or a pulse voltage biased to the positive side.

Metal may be exposed from the inner surfaces of the housings of the plasma-separation-unit-side connecting portion 62 and the particle trap portion 63, and the inner surfaces of the housings may be covered with an insulating film. A negative voltage may be applied to the entire plasma-separation-unit-side connecting portion 62, or, for example, a negative voltage may be applied to a deposition preventing plate provided in the plasma-separation-unit-side connecting portion 62.

Figure 6:
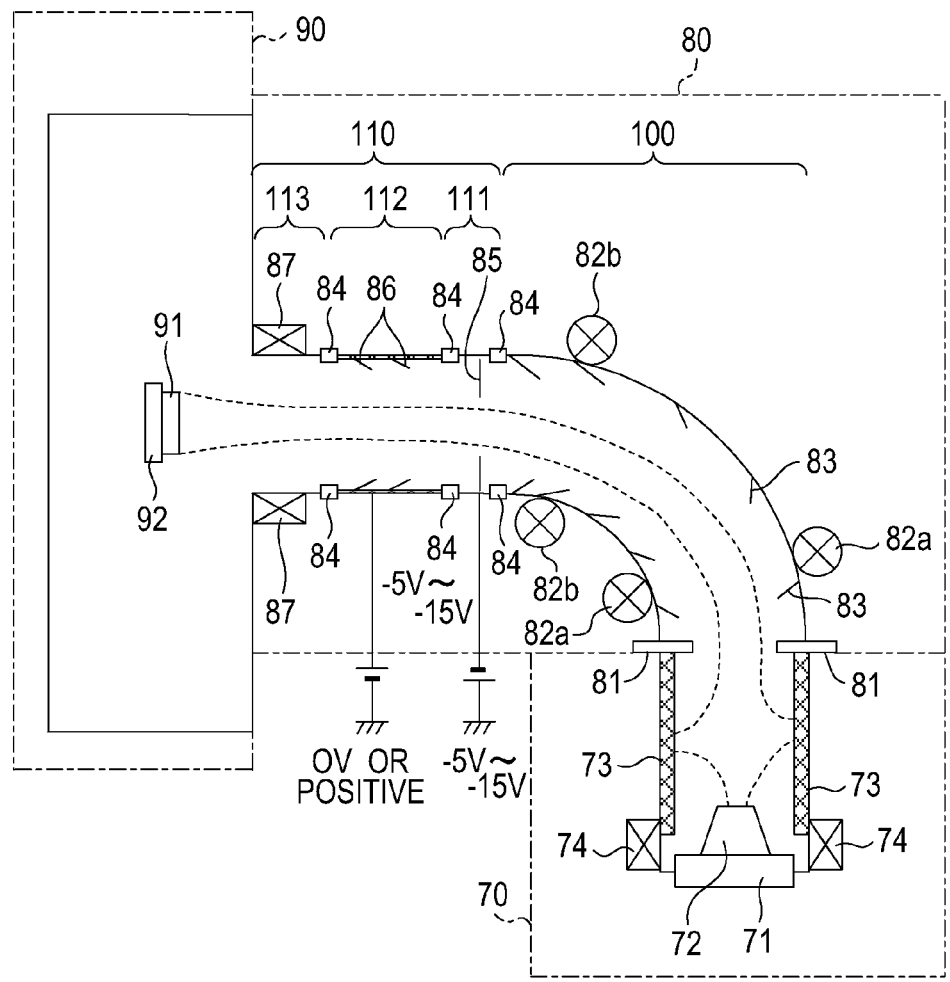
FIG. 6 illustrates an exemplary film deposition apparatus.

FIG. 6 illustrates an exemplary film deposition apparatus.

The film deposition apparatus illustrated in FIG. 6 includes a plasma generating section 70, a magnetic-field filter section 80, and a film deposition chamber 90. Housings of the plasma generating section 70, the magnetic-field filter section 80, and the film deposition chamber 90 may mainly include metal such as stainless steel. The magnetic-field filter section 80 is divided into a plasma separation unit 100 and a particle transfer unit 110.

The plasma generating section 70 includes an insulating plate 71, a cathode target 72, an anode 73, and a cathode coil 74. By applying a given voltage between the cathode target 72 and the anode 73, plasma is generated above the cathode target 72. By supplying a given current to the cathode coil 74, a magnetic field for stabilizing the plasma is produced.

The plasma separation unit 100 includes a cylinder that is substantially curved 90° in an arc form. An insulating ring 81 including a material having a high insulating performance, such as fluorine resin, is provided at a boundary between the plasma separation unit 100 and the plasma generating section 70. A plurality of guide coils 82a and 82b provided on the outer periphery of the housing of the plasma separation unit 100 form magnetic fields for moving plasma generated by the plasma generating section 70 toward the film deposition chamber 90 while converging the plasma to the center of the housing. A plurality of fins 83 are provided inside the plasma separation unit 100 in a manner such as to be arranged obliquely with respect to an inner surface of the plasma separation unit 100.

The particle transfer unit 110 includes a negative-voltage application portion 111 provided close to the plasma separation unit 100, a particle removing portion 112, and a connecting portion 113 provided close to the film deposition chamber 90. Insulating rings 84 are provided between the negative-voltage application portion 111 and the plasma separation unit 100, between the negative-voltage application portion 111 and the particle removing portion 112, and between the particle removing portion 112 and the connecting portion 113. The insulating rings 84 may include an insulating material such as fluorine resin. The insulating rings 84 electrically separate the housings of the unit and portions.

The negative-voltage application portion 111 includes a deposition preventing plate (aperture) 85 having an aperture that limits a passage of the plasma. A voltage within the range of −5 to −15 V may be applied to the deposition preventing plate 85.

A plurality of fins 86 are provided in the particle removing portion 112, and are arranged obliquely with respect to an inner surface of the housing. A ground voltage (0 V) or a positive voltage may be applied from a power supply to the particle removing portion 112.

The connecting portion 113 is coupled to the film deposition chamber 90. On the outer periphery of the housing of the connecting portion 113, a guide coil 87 is provided to produce a magnetic field for transferring the plasma from the particle removing portion 112 into the film deposition chamber 90. The film deposition chamber 90 includes a stage 92 on which a substrate 91 to be subjected to film deposition is placed.

The above-described film deposition apparatus may form a carbon film using graphite serving as the cathode target 72.

The pressure in the film deposition apparatus is kept at, for example, $10^{-5}$ to $10^{-3}$ Pa, and a given voltage and a given current are respectively supplied between the cathode target 72 and the anode 73 and to the cathode coil 74, thereby generating plasma.

The plasma generated by the plasma generating section 70 enters the magnetic-field filter section 80, is converged to the center of the housing by magnetic fields generated by the guide coils 82a and 82b on the outer periphery of the housing of the plasma separation unit 100, and moves toward the film deposition chamber 90 along the curved housing.

Electrically neutral particles or particles having a low charge for the mass, which are generated by arc discharging in the plasma generating section 70, may move straight in the housing substantially without being influenced by the magnetic fields generated by the guide coils 82a and 82b. Most of the particles are repetitively reflected by the inner wall of the plasma separation unit 100, the fins 83, or the deposition preventing plate 85 provided at the entrance of the negative-voltage application portion 111, and are finally trapped by the inner wall of the plasma separation unit 100, the fins 83, or the deposition preventing plate 85.

Some of the positively charged particles move together with the plasma, pass through the aperture of the deposition preventing plate 85, and enter the negative-voltage application portion 111. Since a negative voltage is applied to the deposition preventing plate 85, the positively charged particles are separated from the plasma by an electrical attracting force, and are trapped by, for example, the fins 86 provided in the particle removing portion 112 or the wall surface of the housing.

The plasma from which the particles are removed enters the film deposition chamber 90, and carbon deposits on the substrate 91 to form a carbon film. Broken lines in FIG. 6 indicate a moving path of the plasma.

The positively charged particles are separated from the plasma by the negative-voltage application portion 111 in the particle transfer unit 110, and are trapped by the fins 86 and the wall surface of the housing. The particles which enter the film deposition chamber 90 may be reduced. In this case, a high-quality and high-density carbon film that includes a reduced particles is formed on the substrate 91. Since a ground voltage or a positive voltage is applied to the particle removing portion 112 provided downstream of the negative-voltage application portion 111, the film deposition material in the plasma passing through the negative-voltage application portion 111 is not separated from the plasma. For this reason, the film deposition speed may not decrease. Hence, a high-quality and high-density carbon film that includes a reduced number of particles may be formed on the substrate 91.

Figure 7:
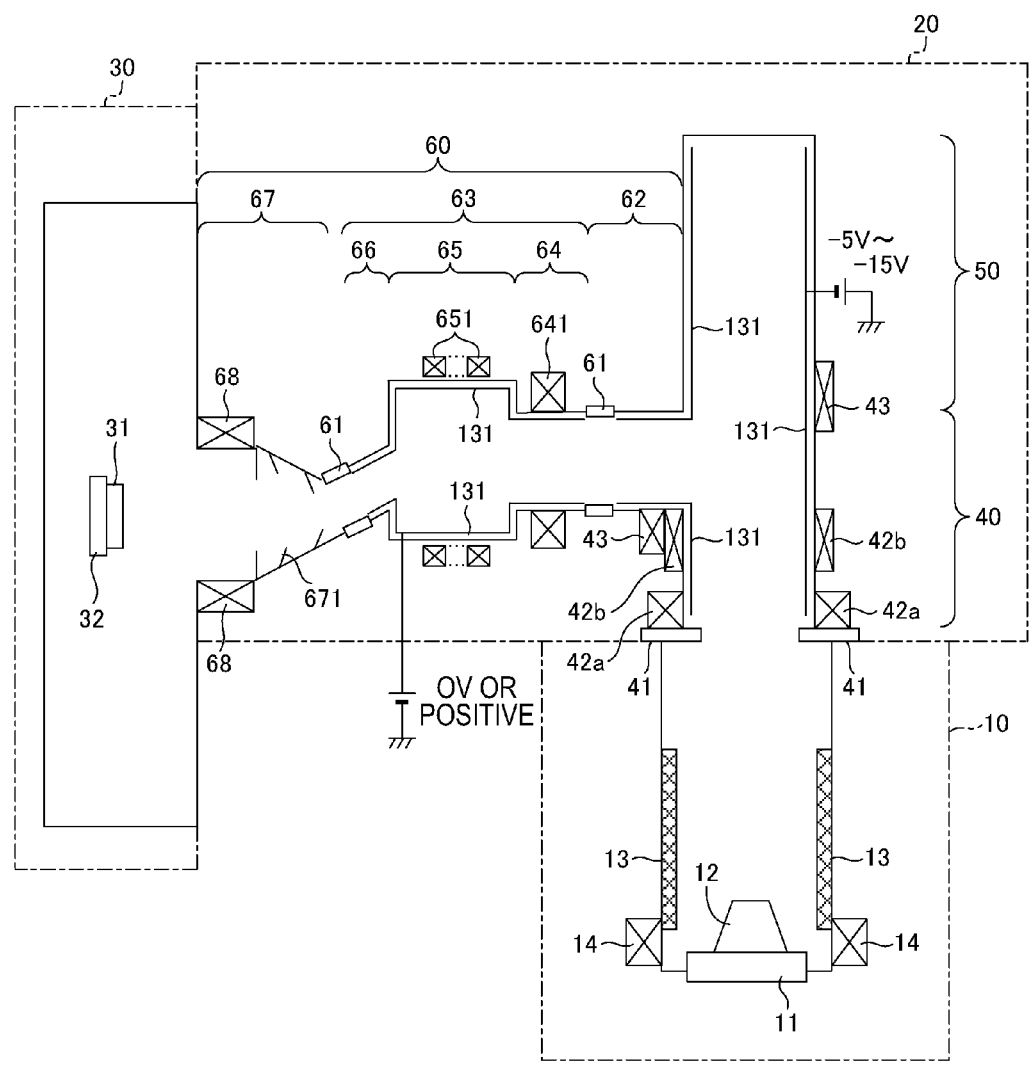
FIG. 7 illustrates an exemplary film deposition apparatus.

FIG. 7 illustrates an exemplary film deposition apparatus. The film deposition apparatus illustrated in FIG. 7 includes electrode plates 131 detachably provided in a housing of a magnetic-field filter section 20. Other elements are substantially identical or similar to those illustrated in FIG. 1. In FIG. 7, the elements substantially identical or similar to those in FIG. 1 are denoted by the same reference numerals.

The electrode plates 131 are detachably provided on inner sides of a plasma separation unit 40, a particle trap unit 50, and a connecting portion 62 and a particle trap portion 63 of a plasma transfer unit 60.

Figure 8:
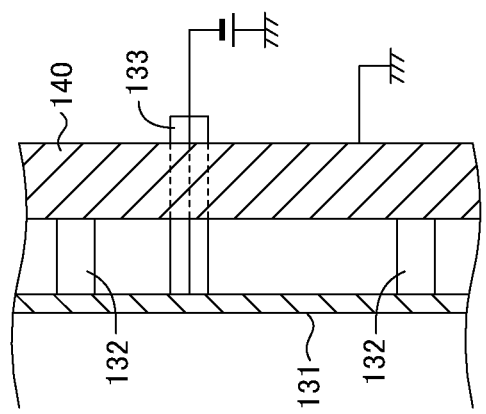
FIG. 8 illustrates an exemplary electrode plate.

FIGS. 8, 9, 10, 11A, and 11B illustrate exemplary electrode plates. For example, an electrode plate 131 is placed on an inner side of a housing 140 with insulating spacers 132 being disposed therebetween, and is electrically separated from the housing 140, as illustrated in FIG. 8. The electrode plate 131 is electrically coupled to a power supply via an insulating terminal introducing portion 133. For example, a voltage within the range of −5 to −15 V may be applied to the electrode plates 131 provided in the plasma separation unit 40, the particle trap unit 50, and the connecting portion 62. A ground voltage, such as 0 V, or a positive voltage may be applied to the electrode plate 131 provided in the particle trap portion 63. The housing of the film deposition apparatus may be kept at a ground voltage.

Figure 9:
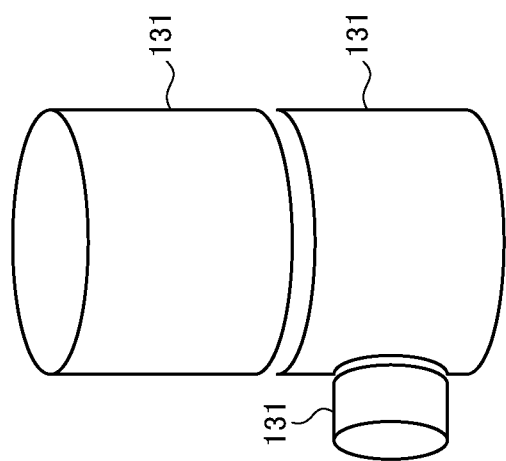
FIG. 9 illustrates an exemplary electrode plate.

The electrode plates 131 include stainless steel plates having a thickness of 0.5 to 1 mm as an example. The electrode plates 131 in the plasma separation unit 40, the particle trap unit 50, and the connecting portion 62 may be integrally formed, as illustrated in FIG. 7, or may be separate from one another, as illustrated in FIG. 9. The electrode plates 131 may be easily detachable, and for example, may be electrically coupled to one another via wiring members. The electrode plate 131 provided in the particle trap portion 63 may be divided into a plurality of parts, and in this case, the parts of the electrode plate 131 are coupled electrically.

When film deposition is repeated, particles deposit on the inner side of the housing of the film deposition apparatus, and therefore, maintenance, such as replacement or cleaning, may be performed. The particles are adsorbed by the electrode plates 131 provided on the inner side of the housing of the film deposition apparatus. Since the electrode plates 131 include thin metal plates (stainless steel plates), they may be easily replaced or cleaned.

The film deposition apparatus illustrated in FIG. 7 may provide advantages substantially identical or similar to those of the film deposition apparatus illustrated in FIG. 1. Maintenance after long periods of operation may be reduced and mass productivity may be improved.

Figure 10:
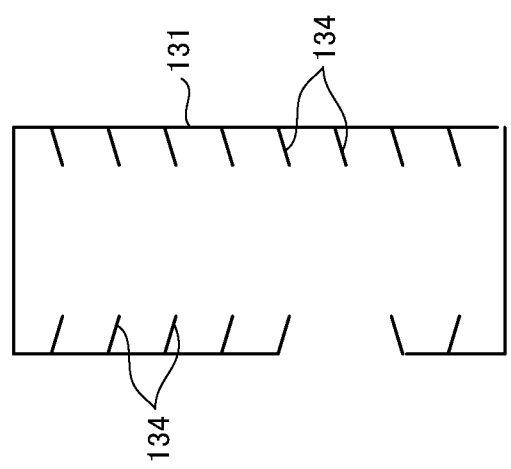
FIG. 10 illustrates an exemplary electrode plate.
Figure 11A:
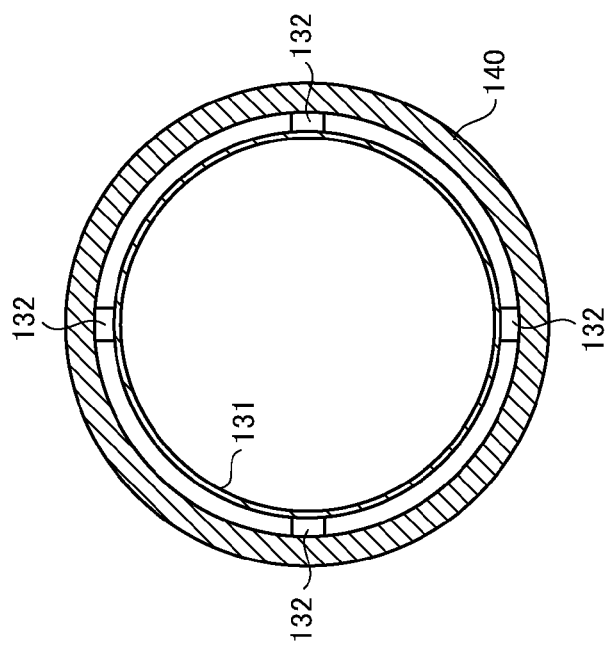
FIGS. 11A and 11B illustrate exemplary electrode plates.
Figure 11B:
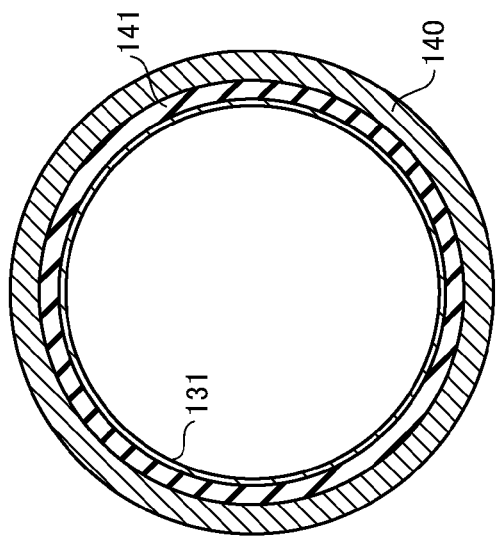

Fins 134 for trapping the particles may be provided on the inner surface of the electrode plate 131, as illustrated in FIG. 10. Insulating spacers 132 may electrically separate the electrode plate 131 and the housing 141, as illustrated in FIG. 8 or FIG. 11A. Alternatively, an insulating material 141 for covering the inner surface of the housing 140 may electrically separate the electrode plate 131 and the housing 140, as illustrated in FIG. 11B.

Figure 12:
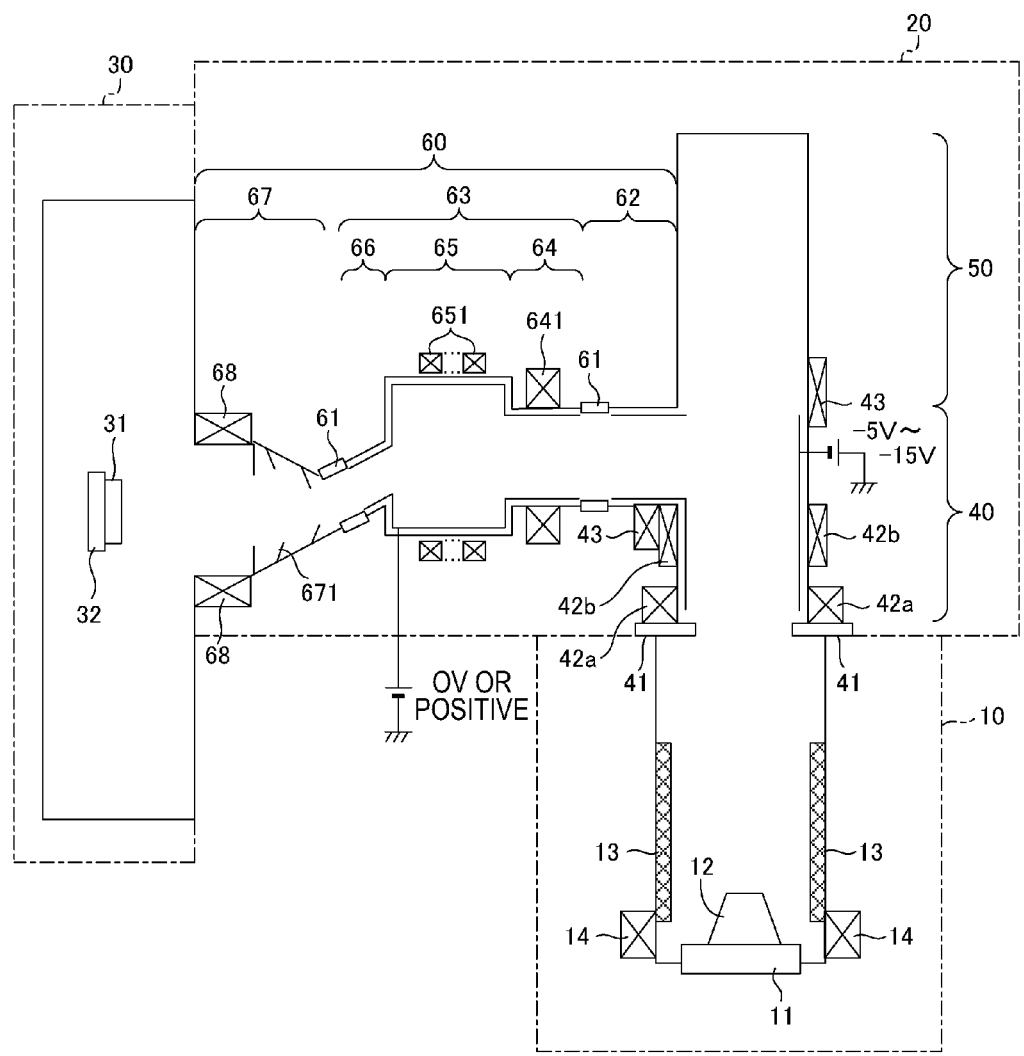
FIG. 12 illustrates an exemplary film deposition apparatus.

FIG. 12 illustrates an exemplary film deposition apparatus. The film deposition apparatus illustrated in FIG. 12 may not include the electrode plate 131 provided in the particle trap unit 50 illustrated in FIG. 7. Other elements may be substantially identical or similar to the elements of the film deposition apparatus illustrated in FIG. 7. In FIG. 12, the elements substantially identical or similar to the elements illustrated in FIG. 7 are denoted by the same reference numerals.

Electrode plates 131 are provided on inner sides of housings of a plasma separation unit 40 and a particle trap portion 63. Since the electrode plates 131 illustrated in FIG. 12 remove charged particles from the plasma, the electrode plates 131 may be arranged along an area where the plasma passes. The film deposition apparatus illustrated in FIG. 12 may provide advantages substantially identical or similar to those of the film deposition apparatus illustrated in FIG. 1.

Figure 13:
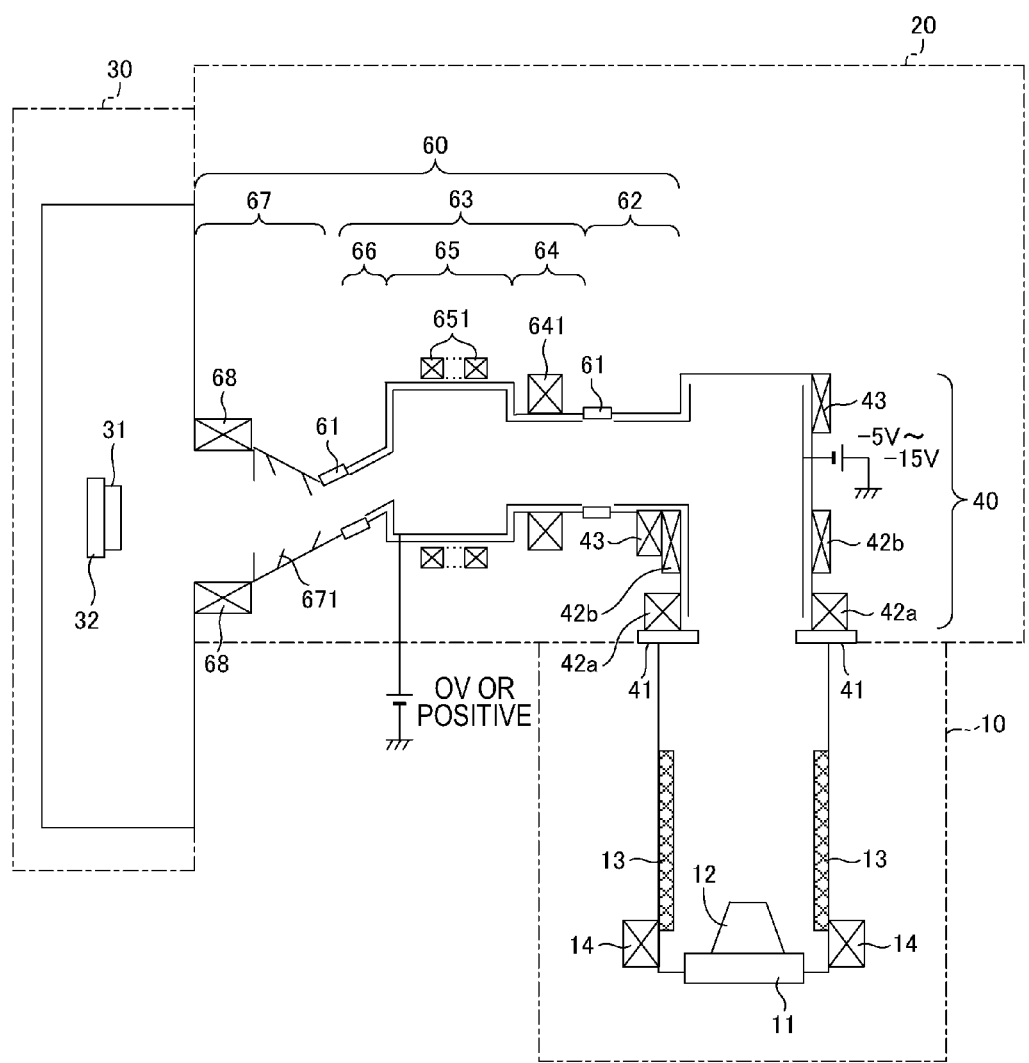
FIG. 13 illustrates an exemplary film deposition apparatus.

FIG. 13 illustrates an exemplary film deposition apparatus. The film deposition apparatus illustrated in FIG. 13 may not include a particle trap unit 50 illustrated in FIG. 12. Other elements may be substantially identical or similar to the elements of the film deposition apparatus illustrated in FIG. 12. In FIG. 13, the elements substantially identical or similar to the elements illustrated in FIG. 12 are denoted by the same reference numerals.

Since the moving direction of the plasma is bent by an oblique-magnetic-field generating coil 43, an upper portion of a plasma separation unit 40 protrudes upward from a connecting portion to a plasma transfer unit 60 by an amount corresponding to the oblique-magnetic-field generating coil 43.

The film deposition apparatus illustrated in FIG. 13 may provide advantages substantially identical or similar to those of the film deposition apparatus illustrated in FIG. 1. Since the film deposition apparatus illustrated in FIG. 13 does not include a particle trap unit, it may be small and easy to handle.

The film deposition apparatus may form films from various materials.

Example embodiments of the present invention have now been described in accordance with the above advantages. It will be appreciated that these examples are merely illustrative of the invention. Many variations and modifications will be apparent to those skilled in the art.

The invention claimed is:

1. A film deposition method comprising:

performing a process using a film deposition apparatus including: a plasma generating section; a film deposition chamber in which a base material is placed; a magnetic-field filter section configured to transfer the plasma to the film deposition chamber and include: a first housing area which includes a plasma separation unit configured to remove a particle and a charged particle from the plasma output from the plasma generating section, and a first particle trap unit configured to trap the particle and the charged particle which go straight from the plasma separation unit and enter the first particle trap unit by first fins which are provided at an end of the first particle trap unit in an entering direction of the particle and the charged particle and are arranged obliquely with respect to an inner surface of the first housing area; and a second housing area provided downstream of the first housing area in the moving direction of the plasma and including a second particle trap unit configured such that the charged particle is removed from the plasma transferred from the first housing area; a first insulating portion configured to electrically separate the plasma generating section from the first housing area; a second insulating portion configured to electrically separate the first housing area from the second housing area; and a third insulating portion configured to electrically separate the second housing area from the film deposition chamber, wherein the second housing area is provided perpendicularly to the first housing area such that the plasma in the first housing area turns, at the plasma separation unit, in a direction perpendicular to the first housing area to enter the second housing while the particle and the charged particle come straight from the plasma separation unit to the first particle trap unit, wherein the second particle trap unit includes a first deposition preventing plate which narrows an input window of the plasma by using, at an input portion of the second particle trap unit, a first aperture in which a first opening is located at an upper side of the second particle trap unit with respect to a center of the first aperture and a second deposition preventing plate which narrows an output window of the plasma by using, at an output portion of the second particle trap unit, a second aperture in which a second opening is located at a lower side of the second particle trap unit with respect to the center of the second aperture, in a manner such that a moving of direction of the plasma bends once in the second particle trap unit and the plasma outputs linearly from the second particle trap unit via the second aperture; and depositing a film over the base material in the film deposition chamber via the process, wherein the process includes:

generating plasma between a cathode target and an anode in the plasma generating section;

separating the particle and the charged particle from the plasma by applying a magnetic field or electric field to the plasma in the magnetic-field filter section;

forming the film by depositing ion included in the plasma passing through the magnetic-field filter section onto the base material in the film deposition chamber;

applying a first voltage to an entirety of the first housing area of the magnetic-field filter section; and applying a second voltage to an entirety of the second housing area of the magnetic-field filter section in such a manner that the plasma is compressed in the second housing area by the magnetic field or electric field generated by the applied second voltage.

2. The film deposition method according to claim 1, wherein the first voltage is applied to a first electrode electrically separated from the first housing area, and wherein the second voltage is applied to a second electrode electrically separated from the second housing area.

3. The film deposition method according to claim 1, wherein the first voltage is a negative voltage, and the second voltage is higher than the first voltage.

4. The film deposition method according to claim 1, wherein the first voltage is within a range of −5 to −15 V, and the second voltage is either a ground voltage or a positive voltage.

5. The film deposition method according to claim 1, further comprising:

separating the plasma from the particle by the magnetic field;

transferring the separated plasma to the film deposition chamber; and curving a transfer path of the plasma by a coil.

6. The film deposition method according to claim 1, wherein graphite is used as the cathode target.

7. The film deposition method according to claim 1, wherein the base material includes a substrate for forming a magnetic recording medium or a substrate for forming a magnetic head.

* * * * *